(12) United States Patent
Bathan et al.

(10) Patent No.: US 8,106,502 B2
(45) Date of Patent: Jan. 31, 2012

(54) INTEGRATED CIRCUIT PACKAGING SYSTEM WITH PLATED PAD AND METHOD OF MANUFACTURE THEREOF

(75) Inventors: Henry Descalzo Bathan, Singapore (SG); Zigmund Ramirez Camacho, Singapore (SG); Jairus Legaspi Pisigan, Singapore (SG); Lionel Chien Hui Tay, Singapore (SG)

(73) Assignee: Stats Chippac Ltd., Singapore (SG)

( * ) Notice: Subject to any disclaimer, the term of this patent is extended or adjusted under 35 U.S.C. 154(b) by 302 days.

(21) Appl. No.: 12/272,751

(22) Filed: Nov. 17, 2008

(65) Prior Publication Data

US 2010/0123229 A1 May 20, 2010

(51) Int. Cl.
 H01L 23/48 (2006.01)
 H01L 23/52 (2006.01)
 H01L 23/495 (2006.01)
 H01L 29/40 (2006.01)
 H01L 21/00 (2006.01)

(52) U.S. Cl. ........ 257/690; 257/676; 257/693; 257/696; 257/735; 257/E21.502; 257/E21.503; 257/E23.123; 438/26; 438/124; 438/126; 438/127

(58) Field of Classification Search .................. 257/690, 257/696, 735, E23.048, E23.123, 676, 693, 257/E21.502, E21.503; 438/26, 124, 126, 438/127
See application file for complete search history.

(56) References Cited

U.S. PATENT DOCUMENTS

| | | | | |
|---|---|---|---|---|
| 5,345,106 A * | 9/1994 | Doering et al. | | 257/675 |
| 5,416,662 A * | 5/1995 | Kurasawa et al. | | 361/118 |
| 5,440,169 A * | 8/1995 | Tomita et al. | | 257/667 |
| 6,072,239 A | 6/2000 | Yoneda et al. | | |
| 6,093,960 A * | 7/2000 | Tao et al. | | 257/706 |
| 6,191,494 B1 | 2/2001 | Ooyama et al. | | |
| 6,396,139 B1 * | 5/2002 | Huang | | 257/696 |
| 6,495,909 B2 * | 12/2002 | Jung et al. | | 257/684 |
| 6,700,188 B2 * | 3/2004 | Lin | | 257/684 |
| 6,818,973 B1 * | 11/2004 | Foster | | 257/676 |
| 6,838,757 B2 * | 1/2005 | Abbott et al. | | 257/677 |
| 6,861,295 B2 * | 3/2005 | Jung et al. | | 438/124 |
| 7,009,304 B2 * | 3/2006 | Bando et al. | | 257/777 |
| 7,211,471 B1 | 5/2007 | Foster | | |
| 7,270,867 B1 | 9/2007 | Kwan et al. | | |
| 7,294,912 B2 * | 11/2007 | Takeuchi et al. | | 257/675 |
| 7,315,077 B2 * | 1/2008 | Choi et al. | | 257/666 |
| 7,435,619 B2 | 10/2008 | Shim et al. | | |
| 7,602,050 B2 * | 10/2009 | Sharma et al. | | 257/666 |
| 7,622,332 B2 * | 11/2009 | Islam et al. | | 438/123 |
| 7,790,500 B2 * | 9/2010 | Ramos et al. | | 438/106 |

(Continued)

FOREIGN PATENT DOCUMENTS

KR 2001001160 A * 1/2001

*Primary Examiner* — Ida M Soward

(74) *Attorney, Agent, or Firm* — Mikio Ishimaru

(57) ABSTRACT

A method of manufacture of an integrated circuit packaging system includes: forming an external interconnect; forming a first planar terminal adjacent to the external interconnect and non-planar to a portion the external interconnect; mounting a first integrated circuit over the first planar terminal; connecting the first integrated circuit with the external interconnect; and forming an encapsulation over the first planar terminal covering the first integrated circuit and with the external interconnect extending from a non-horizontal side of the encapsulation and with the first planar terminal coplanar with the adjacent portion of the encapsulation exposing the first planar terminal.

20 Claims, 12 Drawing Sheets

U.S. PATENT DOCUMENTS

| | | | |
|---|---|---|---|
| 7,833,827 B1 * | 11/2010 | Lin et al. | 438/106 |
| 7,875,988 B2 * | 1/2011 | Shoji et al. | 257/798 |
| 2002/0140064 A1 * | 10/2002 | Wu et al. | 257/670 |
| 2006/0033184 A1 * | 2/2006 | Park et al. | 257/666 |
| 2007/0052076 A1 * | 3/2007 | Ramos et al. | 257/676 |
| 2007/0135055 A1 * | 6/2007 | Ho et al. | 455/67.11 |
| 2007/0216011 A1 * | 9/2007 | Otremba et al. | 257/690 |
| 2007/0257348 A1 * | 11/2007 | Yang | 257/686 |
| 2008/0174012 A1 * | 7/2008 | Otsuki | 257/737 |
| 2008/0224290 A1 * | 9/2008 | Abbott | 257/676 |
| 2008/0246132 A1 * | 10/2008 | Kasuya et al. | 257/676 |
| 2008/0258291 A1 * | 10/2008 | Liu et al. | 257/690 |
| 2009/0039486 A1 * | 2/2009 | Shimazaki et al. | 257/676 |
| 2009/0230526 A1 * | 9/2009 | Chen et al. | 257/676 |
| 2009/0305466 A1 * | 12/2009 | Lee et al. | 438/121 |
| 2009/0321913 A1 * | 12/2009 | Shim et al. | 257/690 |
| 2010/0013070 A1 * | 1/2010 | Lee et al. | 257/676 |

* cited by examiner

INTEGRATED CIRCUIT PACKAGING SYSTEM WITH PLATED PAD AND METHOD OF MANUFACTURE THEREOF

TECHNICAL FIELD

The present invention relates generally to an integrated circuit packaging system and more particularly to an integrated circuit packaging system with a lead.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. The packages have a lead frame whose leads are projected from the package body, to provide a path for signal transfer between the die and external devices. Other conventional package configurations have contact planar terminals or pads formed directly on the surface of the package. Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

Different challenges arise from increased functionality integration and miniaturization. For example, a semiconductor product having increased functionality may be made smaller but may still be required to provide a large number of inputs/outputs (I/O). The size reduction increases the I/O density or decreases the I/O pitch for the integrated circuit package and its respective integrated circuit carriers.

The ever-increasing I/O density trend presents a myriad of manufacturing problems. Some of these problems reside in integrated circuit manufacturing realm, such as fine pitch connections and reliability of these connections. Others problems involve mounting these increase I/O density integrated circuits on carriers for packaging. Yet other problems reside in the realm of the printed circuit board or the system board that receives the integrated circuit package having the fine pitch I/O or a large number of I/Os in an ever-shrinking space.

An exemplary semiconductor package, well known in the electronics industry, is the quad flat package ("QFP"). QFP packages typically comprise a lead frame, such as a conductive sheet stamped and etched, with a semiconductor die having a multitude of bond pads mounted to the top side of the lead frame. Bond wires electrically connect the bond pads, of the semiconductor die, to a series of conductive lead fingers on the topside of the lead frame. Typically, the semiconductor die and the bond wires are encapsulated within a molding compound.

In order to reduce manufacturing costs, the electronics industry is increasing the usage of QFP packages. In the manufacturing process, many obstacles must be overcome to deliver extremely small packages with thinner and thinner profile in high volume while providing connectivity to a large number of I/O. Despite the trend towards miniaturization and thinner profile, more functions and more integrated circuits are continued to be packed into QFP packages.

Thus, a need still remains for an integrated circuit packaging system providing low cost manufacturing, improved yield, improved reliability, and high density I/O count. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including forming an external interconnect; forming a first planar terminal adjacent to the external interconnect and non-planar to a portion of the external interconnect; mounting a first integrated circuit over the first planar terminal; connecting a first integrated circuit with the external interconnect; and forming an encapsulation over the first planar terminal covering the first integrated circuit and with the external interconnect extending from a non-horizontal side of the encapsulation and with the first planar terminal coplanar with the adjacent portion of the encapsulation exposing the first planar terminal.

The present invention provides an integrated circuit packaging system including an external interconnect; a first planar terminal adjacent to the external interconnect and non-planar to a portion the external interconnect; a first integrated circuit over the first planar terminal; a first integrated circuit connected with the external interconnect; and an encapsulation over the first planar terminal covering the first integrated circuit and with the external interconnect extending from a non-horizontal side of the encapsulation and with the first planar terminal coplanar with the adjacent portion of the encapsulation exposing the first planar terminal.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
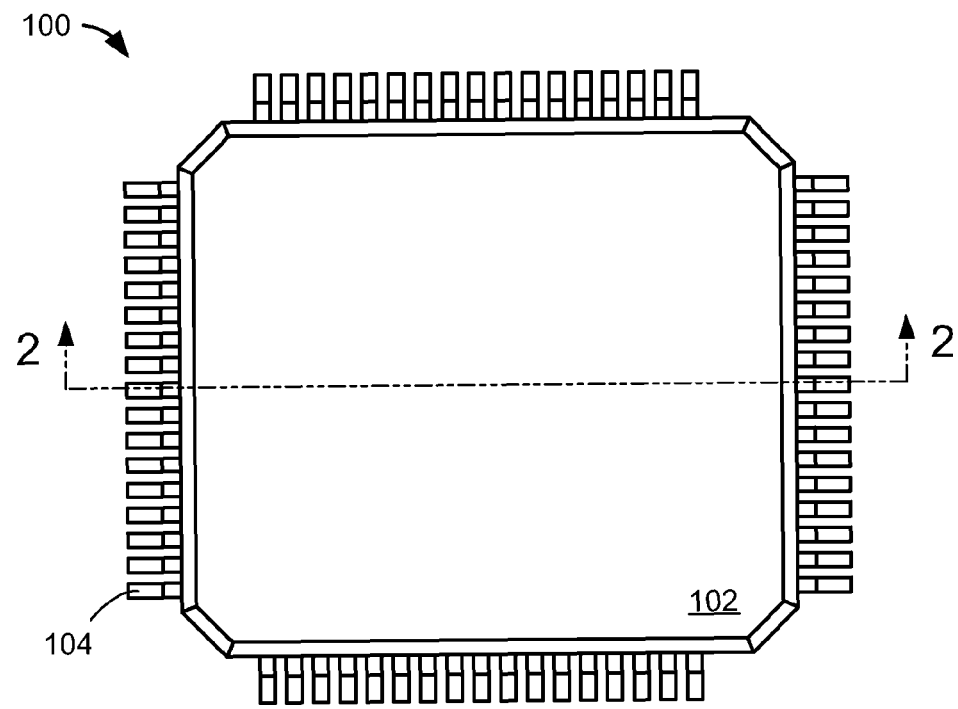
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit packaging system 100 in a first embodiment of the present invention. The top view depicts an encapsulation 102, such as a cover of an epoxy molding compound. External interconnects 104, such as leads, can extend from the encapsulation 102.

Figure 2:
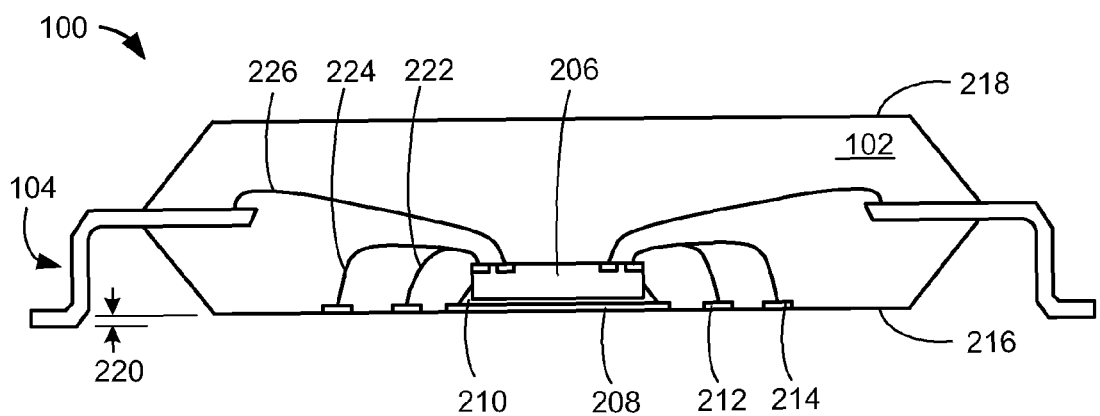
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The integrated circuit packaging system 100 includes a first integrated circuit 206, such as an integrated circuit die, is over a first planar terminal 208, such as a plated pad functioning as a die-attached paddle, with a first adhesive 210 such as a die-attach adhesive.

The first planar terminal 208 is defined as both horizontal sides planar across the entire horizontal side. For expository purposes, the term "planar terminal" as used herein in singular or plural form is defined as having both horizontal sides planar across each of the horizontal side and the exposed portion of the planar terminal is planar with the encapsulation 102 along the perimeter of the planar terminal, regardless of its orientation Second planar terminals 212, such as plated pads, can be between third planar terminals 214 and the first planar terminal 208. The third planar terminals 214, such as plated pads, can be adjacent to a periphery of the integrated circuit packaging system 100.

The external interconnects 104 can extend from the non-horizontal sides of the encapsulation 102. As an example, the external interconnects 104 are shown bending towards a first side 216 of the encapsulation 102. As a different example, the external interconnects 104 can bend towards a second side 218 of the encapsulation 102. Both the first side 216 and the second side 218 are horizontal sides of the encapsulation 102. Each of the external interconnects 104 can have an interconnect height 220 from the first side 216 of the encapsulation 102.

First internal interconnects 222, such as bond wires, ribbon bond wires, or reverse standoff stitch bonding (RSSB), can be between the first integrated circuit 206 and the second planar terminals 212. Second internal interconnects 224, such as bond wires, ribbon bond wires, or reverse standoff stitch bonding (RSSB), can be between the first integrated circuit 206 and the third planar terminals 214. Third internal interconnects 226, such as bond wires, ribbon bond wires, or reverse standoff stitch bonding (RSSB), can be between the first integrated circuit 206 and the external interconnects 104.

For illustrative purposes, the integrated circuit packaging system 100 is shown with the first internal interconnects 222 and the second internal interconnects connecting to the same connection of the first integrated circuit 206, although it is understood that the integrated circuit packaging system 100 can have different connections. For example, the first internal interconnects 222 and the second internal interconnects 224 can connect to different portions of the first integrated circuit 206.

The encapsulation 102 can cover the first integrated circuit 206, the first internal interconnects 222, the second internal interconnects 224, and the third internal interconnects 226. The first planar terminal 208, the second planar terminals 212, the third planar terminals 214, and the external interconnects 104 are partially exposed by the encapsulation 102 and are planar to the first side 216 of the encapsulation 102.

Figure 3:
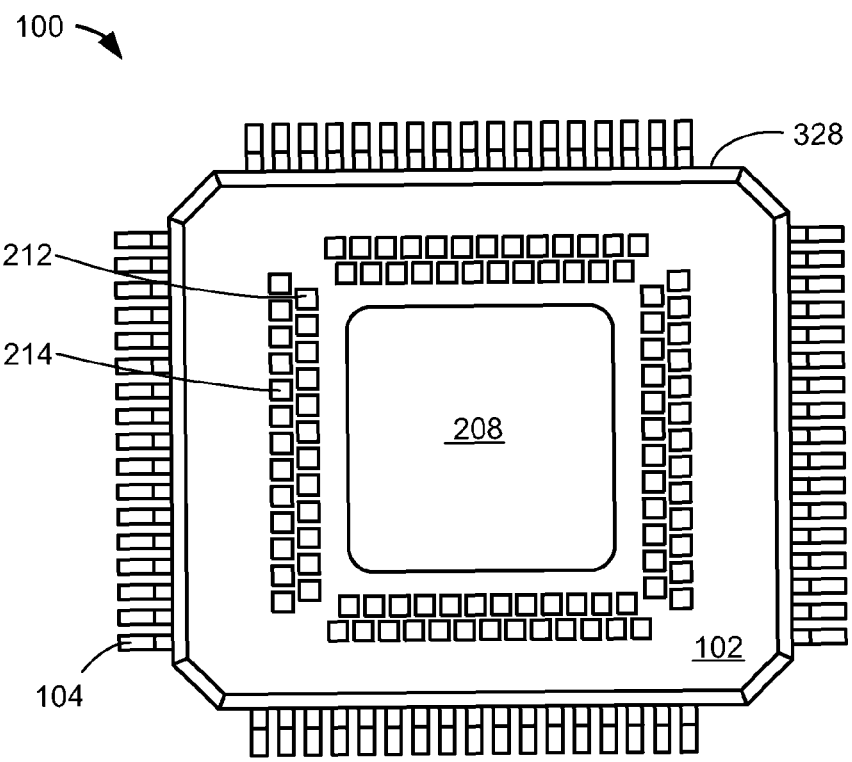
FIG. 3 is a bottom view of the integrated circuit packaging system of FIG. 1.

Referring now to FIG. 3, therein is shown a bottom view of the integrated circuit packaging system 100 of FIG. 1. The bottom view depicts the encapsulation 102 exposing the first planar terminal 208, the second planar terminals 212, and the third planar terminals 214. The second planar terminals 212 and the third planar terminals 214 can be adjacent to and surround the first planar terminal 208. The external interconnects 104 can extend from the encapsulation 102.

For illustrative purposes, the integrated circuit packaging system 100 is shown with one row of the second planar terminals 212 and one row of the third planar terminals 214 in a staggered configuration along all sides 328 of the integrated circuit packaging system 100, although it is understood that the integrated circuit packaging system 100 can include a different number of rows. For example, the integrated circuit packaging system 100 can have multiple rows of the second planar terminals 212, multiple rows of the third planar terminals 214, or different number of rows between the second planar terminals 212 and the third planar terminals 214 along each of the sides 328.

Figure 4:
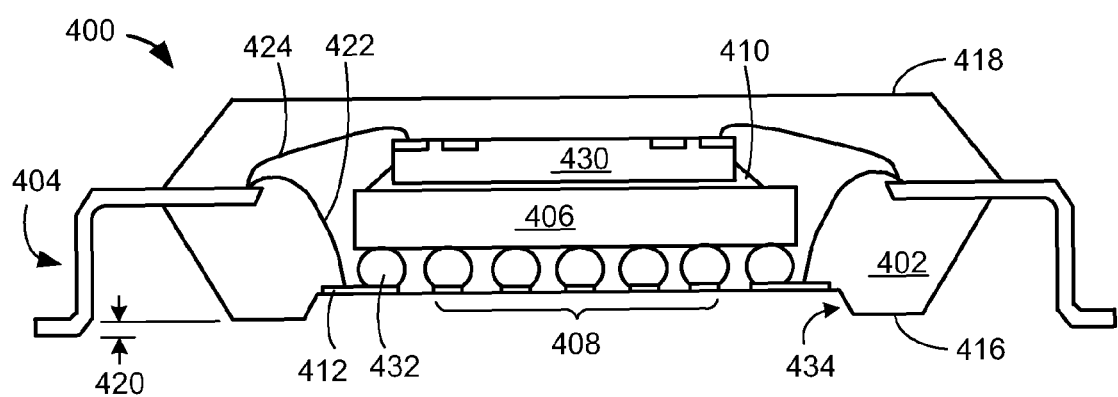
FIG. 4 is a cross-sectional view of an integrated circuit packaging system exemplified by the top view of FIG. 1 in a second embodiment of the present invention.

Referring now to FIG. 4, therein is shown a cross-sectional view of an integrated circuit packaging system 400 as exemplified by the top view of FIG. 1 in a second embodiment of the present invention. The cross-sectional view depicts a first integrated circuit 406, such as a flip chip or a ball grid array packaging integrated circuit, over an array of first planar terminals 408, such as an array of plated pads. A second integrated circuit 430, such as an integrated circuit die, can be attached over the first integrated circuit 406 with a first adhesive 410 such as a die-attach adhesive.

The first integrated circuit 406 is preferably mounted over the first planar terminals 408 and second planar terminals 412, such as plated pads, with conductive balls 432, such as conductive bumps including solder or gold. The second planar terminals 412 can be adjacent and exterior to the array of the first planar terminals 408. The conductive balls 432 of the first integrated circuit 406 preferably electrically connect to the array of the first planar terminals 408 and the second planar terminals 412.

Each of the second planar terminals 412 can have larger surface area than each of the first planar terminals 408 and can preferably accommodate multiple connections. For example, the second planar terminals 412 can connect to the conductive balls 432 and first internal interconnects 422.

External interconnects 404, such as leads, can extend from the non-horizontal sides of an encapsulation 402. As an example, the external interconnects 404 are shown bending towards a first side 416 of the encapsulation 402. A second side 418 is an opposing side to the first side 416 of the integrated circuit packaging system 400. Each of the external interconnects 404 can have an interconnect height 420 from the first side 416 of the encapsulation 402.

The first internal interconnects 422, such as bond wires, ribbon bond wires, or reverse standoff stitch bonding (RSSB), can be between the second planar terminals 412 and the external interconnects 404. Second internal interconnects 424, such as bond wires, ribbon bond wires, or reverse standoff stitch bonding (RSSB), can be between the second integrated circuit 430 and the external interconnects 404.

The encapsulation 402, such as a cover including epoxy molding compound, can cover the first integrated circuit 406, the second integrated circuit 430, the first internal interconnects 422, and the second internal interconnects 424. The first side 416 of the encapsulation 402 is non-planar. The encapsulation 402 forms a cavity 434 partially exposing the first planar terminals 408 and the second planar terminals 412.

The second planar terminals 412 can be at the peripheral portion of the cavity 434. The array of the first planar terminals 408 can be in the non-peripheral portion or an interior portion of the cavity 434.

Figure 5:
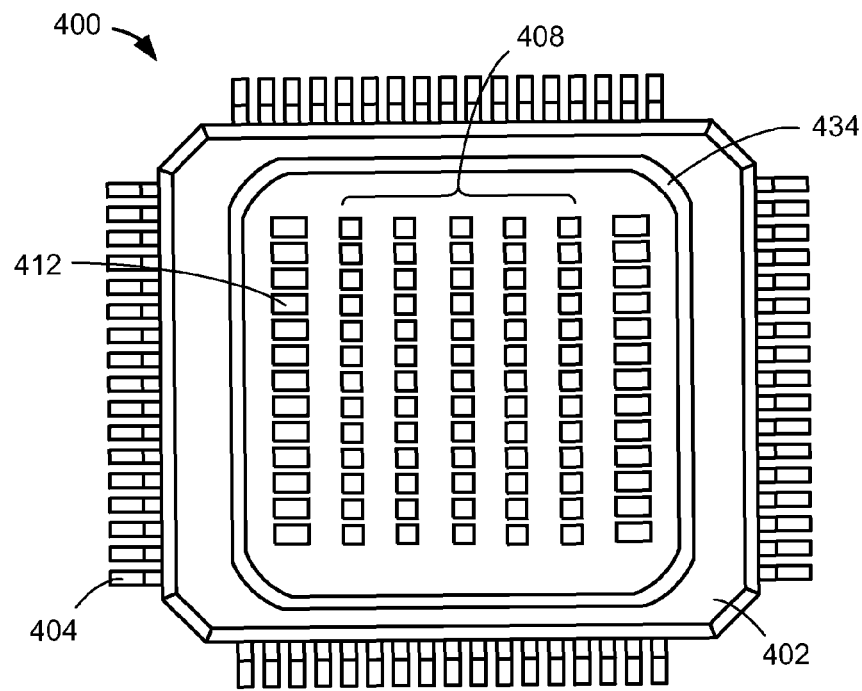
FIG. 5 is a bottom view of the integrated circuit packaging system of FIG. 4.

Referring now to FIG. 5, therein is shown a bottom view of the integrated circuit packaging system 400 of FIG. 4. The bottom view depicts the encapsulation 402 having the cavity 434. The encapsulation 402 can expose the first planar terminals 408 and the second planar terminals 412 within the cavity 434.

One row of the second planar terminals 412 can be adjacent opposite sides of the cavity 434. The first planar terminals 408 can be between the two rows of the second planar terminals 412. The external interconnects 404 can extend from the encapsulation 402.

Figure 6:
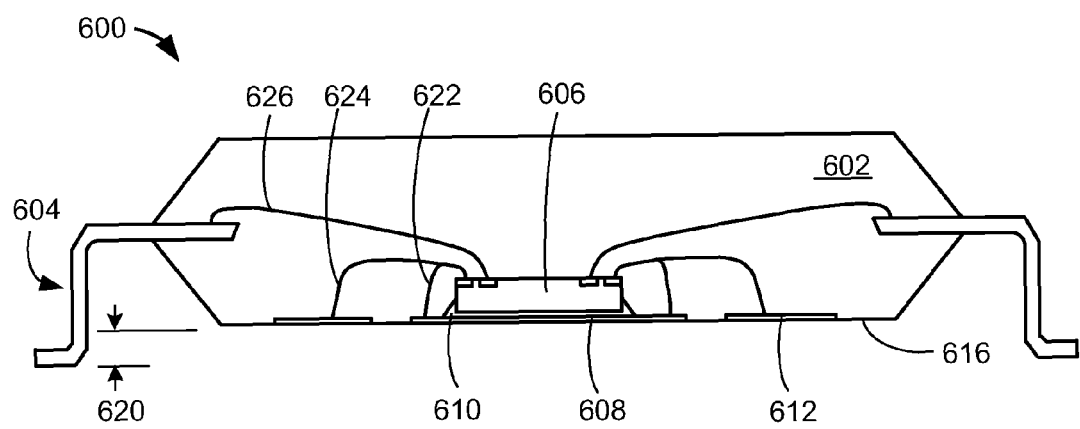
FIG. 6 is a cross-sectional view of an integrated circuit packaging system exemplified by the top view of FIG. 1 in a third embodiment of the present invention.

Referring now to FIG. 6, therein is shown a cross-sectional view of an integrated circuit packaging system 600 as exemplified by the top view of FIG. 1 in a third embodiment of the present invention. The integrated circuit packaging system 600 includes a first integrated circuit 606, such as an integrated circuit die, can be attached over a first planar terminal 608, such as a plated pad functioning as a die-attached paddle, with a first adhesive 610 such as a die-attach adhesive. Second planar terminals 612, such as plated pads, can be adjacent to and surround the first planar terminal 608.

External interconnects 604, such as leads, can extend from the non-horizontal sides of an encapsulation 602. As an example, the external interconnects 604 are shown bending towards a first side 616 of the encapsulation 602. Each of the external interconnects 604 can have an interconnect height 620 from the first side 616 of the encapsulation 602.

First internal interconnects 622, such as bond wires, ribbon bond wires, or reverse standoff stitch bonding (RSSB), can be between the first integrated circuit 606 and the first planar terminal 608. Second internal interconnects 624, such as bond wires, ribbon bond wires, or reverse standoff stitch bonding (RSSB), can be between the first integrated circuit 606 and the second planar terminals 612. Third internal interconnects 626, such as bond wires, ribbon bond wires, or reverse standoff stitch bonding (RSSB), can be between the first integrated circuit 606 and the external interconnects 604.

For illustrative purposes, the integrated circuit packaging system 600 is shown with the first internal interconnects 622 and the second internal interconnects connecting to the same connection of the first integrated circuit 606, although it is understood that the integrated circuit packaging system 600 can have different connections. For example, the first internal interconnects 622 and the Second internal interconnects 624 can connect to different portions of the first integrated circuit 606.

The encapsulation 602 can cover the first integrated circuit 606, the first internal interconnects 622, the second internal interconnects 624, and the third internal interconnects 626. The first planar terminal 608 and the second planar terminals are partially exposed by the encapsulation 602 and are planar to the first side 616 of the encapsulation 602. An interior portion of the external interconnects 604 can be covered by the encapsulation 602. The external interconnects 604 can extend from non-horizontal sides of the encapsulation 602.

Figure 7:
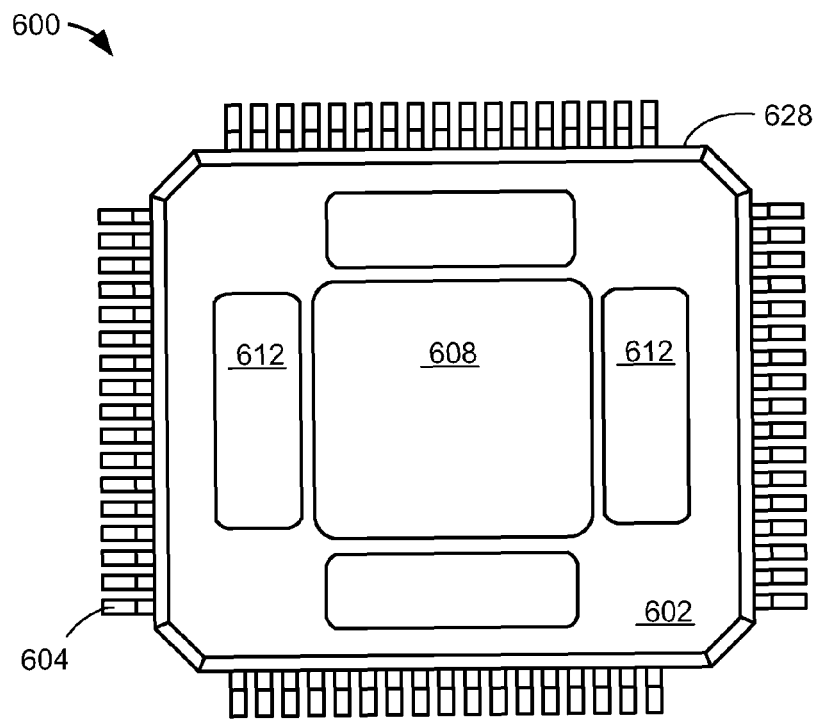
FIG. 7 is a bottom view of the integrated circuit packaging system of FIG. 6.

Referring now to FIG. 7, therein is shown a bottom view of the integrated circuit packaging system 600 of FIG. 6. The bottom view depicts the encapsulation 602 exposing the first planar terminal 608 and the second planar terminals 612. The second planar terminals 612 can be adjacent to and surround each side of the first planar terminal 608. The external interconnects 604 can extend from the non-horizontal sides of the encapsulation 602.

For illustrative purposes, the integrated circuit packaging system 600 is shown with one row of the second planar terminals 612 along all sides 628 of the integrated circuit packaging system 600, although it is understood that the integrated circuit packaging system 600 can include a different number of rows. For example, the integrated circuit packaging system 600 can have more than one row, or different number of rows.

Figure 8:
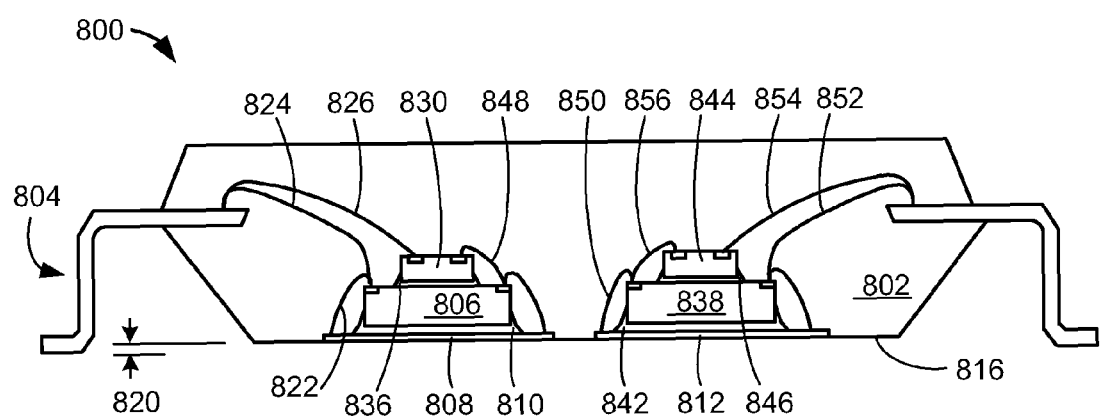
FIG. 8 is a cross-sectional view of an integrated circuit packaging system exemplified by the top view of FIG. 1 in a fourth embodiment of the present invention.

Referring now to FIG. 8, therein is shown a cross-sectional view of an integrated circuit packaging system 800 as exemplified by the top view of FIG. 1 in a fourth embodiment of the present invention. The integrated circuit packaging system 800 includes a first integrated circuit 806, such as an integrated circuit die, can be attached over a first planar terminal 808, such as a plated pad functioning as a die-attached paddle, with a first adhesive 810 such as a die-attach adhesive. A second integrated circuit 830, such as an integrated circuit die, can be attached over the first integrated circuit 806, with a second adhesive 836 such as a die-attach adhesive.

A third integrated circuit 838, such as an integrated circuit die, can be attached over a second planar terminal 812, such as a plated pad functioning as a die-attached paddle, with a third adhesive 842 such as a die-attach adhesive. A fourth integrated circuit 844, such as an integrated circuit die, can be attached over the third integrated circuit 838, with a fourth adhesive 846 such as a die-attach adhesive.

External interconnects 804, such as leads, can extend from the non-horizontal sides of an encapsulation 802. As an example, the external interconnects 804 are shown bending towards a first side 816 of the encapsulation 802. Each of the external interconnects 804 can have an interconnect height 820 from the first side 816 of the encapsulation 802.

First internal interconnects 822, such as bond wires, ribbon bond wires, or reverse standoff stitch bonding (RSSB), can be between the first integrated circuit 806 and the first planar terminal 808. Second internal interconnects 824, such as bond wires, ribbon bond wires, or reverse standoff stitch bonding (RSSB), can be between the first integrated circuit 806 and the external interconnects 804.

Third internal interconnects 826, such as bond wires, ribbon bond wires, or reverse standoff stitch bonding (RSSB), can be between the second integrated circuit 830 and the external interconnects 804. Fourth internal interconnects 848, such as bond wires, ribbon bond wires, or reverse standoff stitch bonding (RSSB), can be between the second integrated circuit 830 and the first integrated circuit 806.

Fifth internal interconnects 850, such as bond wires, ribbon bond wires, or reverse standoff stitch bonding (RSSB), can be between the third integrated circuit 838 and the second planar terminal 812. Sixth internal interconnects 852, such as bond wires, ribbon bond wires, or reverse standoff stitch bonding (RSSB), can be between the third integrated circuit 838 and the external interconnects 804.

Seventh internal interconnects 854, such as bond wires, ribbon bond wires, or reverse standoff stitch bonding (RSSB), can be between the fourth integrated circuit 844 and the external interconnects 804. Eighth internal interconnects 856, such as bond wires, ribbon bond wires, or reverse standoff stitch bonding (RSSB), can be between the fourth integrated circuit 844 and the third integrated circuit 838.

The encapsulation 802 can cover the first integrated circuit 806, the second integrated circuit 830, the third integrated circuit 838, and the fourth integrated circuit 844. The encapsulation 802 can also cover the first internal interconnects 822, the second internal interconnects 824, the third internal interconnects 826, the fourth internal interconnects 848, the fifth internal interconnects 850, the sixth internal interconnects 852, the seventh internal interconnects 854, and the eighth internal interconnects 856. The first planar terminal 808, the second planar terminal 812, and the external interconnects 804, are partially exposed by the encapsulation.

Figure 9:
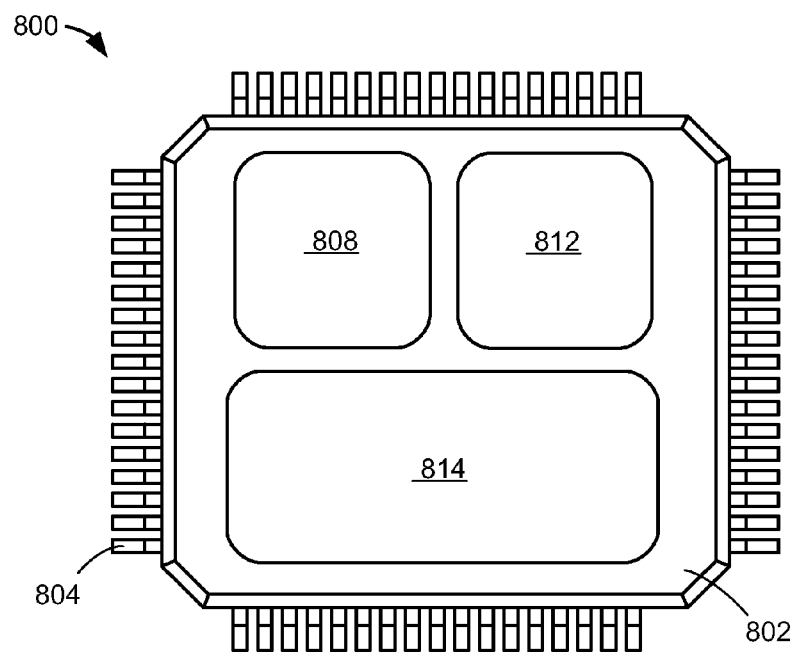
FIG. 9 is a bottom view of the integrated circuit packaging system of FIG. 8.

Referring now to FIG. 9, therein is shown a bottom view of the integrated circuit packaging system 800 of FIG. 8. The bottom view depicts the encapsulation 802 exposing the first planar terminal 808 and the second planar terminal 812. The external interconnects 804, such as leads, can extend from the non-horizontal sides of the encapsulation 802.

A third planar terminal 814, such as a plated pad, can be adjacent to both the first planar terminal 808 and the second planar terminal 812. The third planar terminal 814 can extend the dimension of both the first planar terminal 808 and the second planar terminal 812 along one axis.

Figure 10:
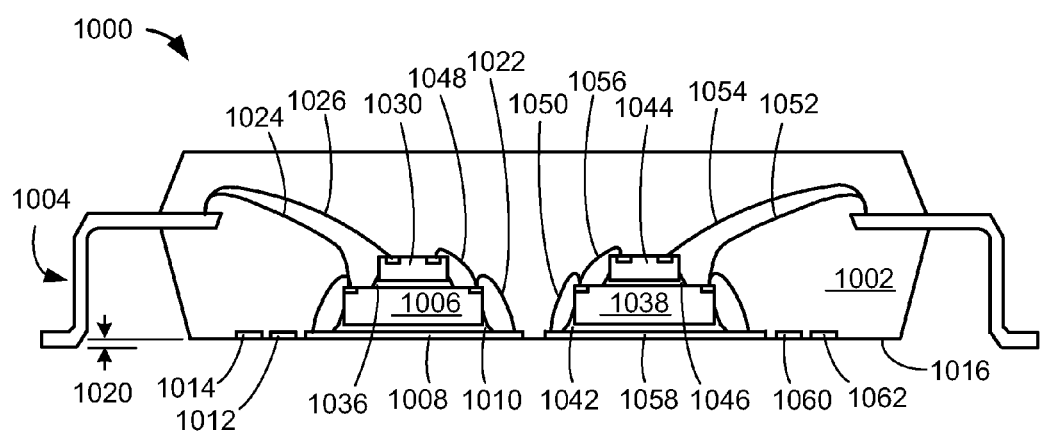
FIG. 10 is a cross-sectional view of an integrated circuit packaging system exemplified by the top view of FIG. 1 in a fifth embodiment of the present invention.

Referring now to FIG. 10, therein is shown a cross-sectional view of an integrated circuit packaging system 1000 as exemplified by the top view of FIG. 1 in a fifth embodiment of the present invention. The integrated circuit packaging system 1000 includes a first integrated circuit 1006, such as an integrated circuit die, can be attached over a first planar terminal 1008, such as a plated pad functioning as a die-attached paddle, with a first adhesive 1010 such as a die-attach adhesive. A second integrated circuit 1030, such as an integrated circuit die, can be attached over the first integrated circuit 1006, with a second adhesive 1036 such as a die-attach adhesive.

A third integrated circuit 1038, such as an integrated circuit die, can be attached over a fourth planar terminal 1058, such as a plated pad functioning as a die-attached paddle, with a third adhesive 1042 such as a die-attach adhesive. A fourth integrated circuit 1044, such as an integrated circuit die, can be attached over the third integrated circuit 1038, with a fourth adhesive 1046 such as a die-attach adhesive.

Second planar terminals 1012, such as plated pads, can be between third planar terminals 1014, such as plated pads, and the first planar terminal 1008. The third planar terminals 1014 can be adjacent to a periphery of the integrated circuit packaging system 1000.

Fifth planar terminals 1060, such as plated pads, can be between sixth planar terminals 1062, such as plated pads, and the fourth planar terminal 1058. The sixth planar terminals 1062 can be adjacent to the periphery of the integrated circuit packaging system 1000.

External interconnects 1004, such as leads, can extend from the non-horizontal sides of an encapsulation 1002. As an example, the external interconnects 1004 are shown bending towards a first side 1016 of the encapsulation 1002. Each of the external interconnects 1004 can have an interconnect height 1020 from the first side 1016 of the encapsulation 1002.

First internal interconnects 1022, such as bond wires, ribbon bond wires, or reverse standoff stitch bonding (RSSB), can be between the first integrated circuit 1006 and the first planar terminal 1008. Second internal interconnects 1024, such as bond wires, ribbon bond wires, or reverse standoff stitch bonding (RSSB), can be between the first integrated circuit 1006 and the external interconnects 1004.

Third internal interconnects 1026, such as bond wires, ribbon bond wires, or reverse standoff stitch bonding (RSSB), can be between the second integrated circuit 1030 and the external interconnects 1004. Fourth internal interconnects 1048, such as bond wires, ribbon bond wires, or reverse standoff stitch bonding (RSSB), can be between the second integrated circuit 1030 and the first integrated circuit 1006.

Fifth internal interconnects 1050, such as bond wires, ribbon bond wires, or reverse standoff stitch bonding (RSSB), can be between the third integrated circuit 1038 and the fourth planar terminal 1058. Sixth internal interconnects 1052, such as bond wires, ribbon bond wires, or reverse standoff stitch bonding (RSSB), can be between the third integrated circuit 1038 and the external interconnects 1004.

Seventh internal interconnects 1054, such as bond wires, ribbon bond wires, or reverse standoff stitch bonding (RSSB), can be between the fourth integrated circuit 1044 and the external interconnects 1004. Eighth internal interconnects 1056, such as bond wires, ribbon bond wires, or reverse standoff stitch bonding (RSSB), can be between the fourth integrated circuit 1044 and the third integrated circuit 1038.

The encapsulation 1002 can cover the first integrated circuit 1006, the second integrated circuit 1030, the third integrated circuit 1038, and the fourth integrated circuit 1044. The encapsulation 1002 can also cover the first internal interconnects 1022, the Second internal interconnects 1024, the Third internal interconnects 1026, the fourth internal interconnects 1048, the fifth internal interconnects 1050, the sixth internal interconnects 1052, the seventh internal interconnects 1054, and the eighth internal interconnects 1056.

The first planar terminal 1008, the second planar terminals 1012, the third planar terminals 1014, and the external interconnects 1004 can be partially exposed by the encapsulation 1002. The encapsulation 1002 can also expose the fourth planar terminal 1058, the fifth planar terminals 1060, and the sixth planar terminals 1062.

Figure 11:
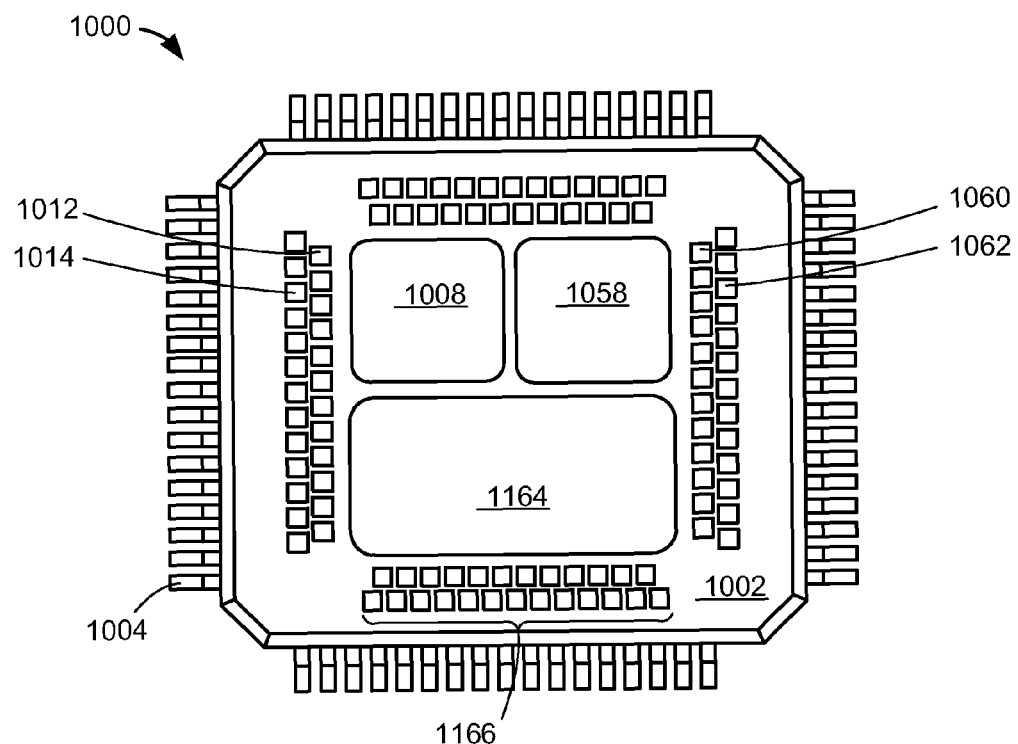
FIG. 11 is a bottom view of the integrated circuit packaging system of FIG. 10.

Referring now to FIG. 11, therein is shown a bottom view of the integrated circuit packaging system 1000 of FIG. 10. The bottom view depicts the encapsulation 1002 exposing the first planar terminal 1008, the second planar terminals 1012, and the third planar terminals 1014. The second planar terminals 1012 and the third planar terminals 1014 can be adjacent a side of the first planar terminal 1008 opposite the fourth planar terminal 1058. The fifth planar terminals 1060 and the sixth planar terminals 1062 can be adjacent to a side of the fourth planar terminal 1058 opposite the first planar terminal 1008.

A seventh planar terminal 1164, as a plated pad, can be adjacent to both the first planar terminal 1008 and the fourth planar terminal 1058. The seventh planar terminal 1164 can extend the dimension of both the first planar terminal 1008 and the fourth planar terminal 1058 along one axis.

Two rows of external planar terminals 1166, such as plated pads, are shown along opposing sides of the integrated circuit packaging system 1000 not occupied by the second planar terminals 1012, the third planar terminals 1014, the fifth planar terminals 1060, and the sixth planar terminals 1062. The external interconnects 1004 can extend from the encapsulation 1002.

Figure 12:
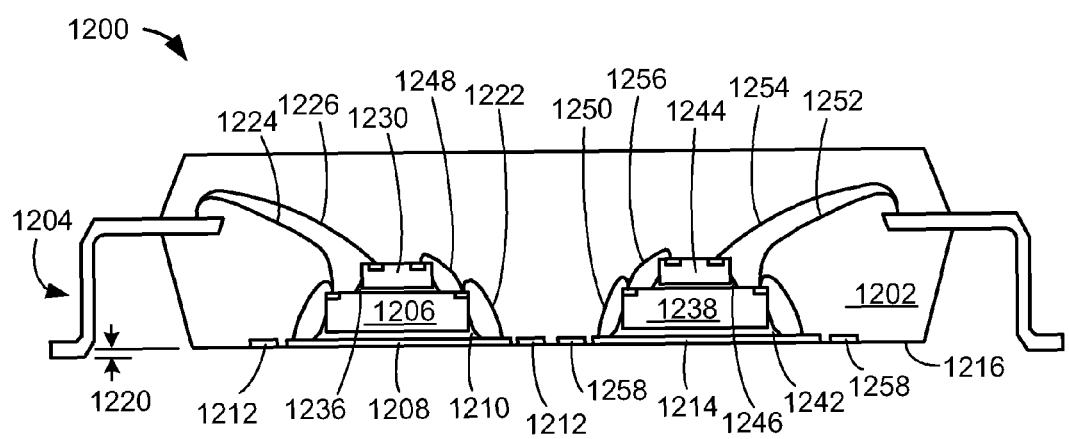
FIG. 12 is a cross-sectional view of an integrated circuit packaging system exemplified by the top view of FIG. 1 in a sixth embodiment of the present invention.

Referring now to FIG. 12, therein is shown a cross-sectional view of an integrated circuit packaging system 1200 as exemplified by the top view of FIG. 1 in a sixth embodiment of the present invention. The integrated circuit packaging system 1200 includes a first integrated circuit 1206, such as an integrated circuit die, can be attached over a first planar terminal 1208, such as a plated pad functioning as a die-attached paddle, with a first adhesive 1210 such as a die-attach adhesive. A second integrated circuit 1230, such as an integrated circuit die, can be attached over the first integrated circuit 1206, with a second adhesive 1236 such as a die-attach adhesive.

A second planar terminals 1212, such as plated pads, can be adjacent to the first planar terminal 1208. The cross-sectional view depicts the second planar terminals 1212 at both sides of the first planar terminal 1208.

The integrated circuit packaging system 1200 can also include a third integrated circuit 1238, such as an integrated circuit die, over a third planar terminal 1214, such as a plated pad functioning as a die-attach paddle. A third adhesive 1242, such as a die-attach adhesive, can attach the third integrated circuit 1238 and the third planar terminal 1214. A fourth integrated circuit 1244, such as an integrated circuit die, can be attached over the third integrated circuit 1238 with a fourth adhesive 1246, such as die-attach adhesive.

Fourth planar terminals 1258, such as plated pads, can be adjacent to the third planar terminal 1214. The cross-sectional view depicts the fourth planar terminals 1258 at both sides of the third planar terminal 1214.

External interconnects 1204 can extend from the non-horizontal sides of an encapsulation 1202. As an example, the external interconnects 1204 are shown bending towards a first side 1216 of the encapsulation 1202. Each of the external interconnects 1204 can have an interconnect height 1220 from the first side 1216 of the encapsulation 1202.

First internal interconnects 1222, such as bond wires, ribbon bond wires, or reverse standoff stitch bonding (RSSB), can be between the first integrated circuit 1206 and the first planar terminal 1208. Second internal interconnects 1224, such as bond wires, ribbon bond wires, or reverse standoff stitch bonding (RSSB), can be between the first integrated circuit 1206 and the external interconnects 1204.

Third internal interconnects 1226, such as bond wires, ribbon bond wires, or reverse standoff stitch bonding (RSSB), can be between the second integrated circuit 1230 and the external interconnects 1204. Fourth internal interconnects 1248, such as bond wires, ribbon bond wires, or reverse standoff stitch bonding (RSSB), can be between the second integrated circuit 1230 and the first integrated circuit 1206.

Fifth internal interconnects 1250, such as bond wires, ribbon bond wires, or reverse standoff stitch bonding (RSSB), can be between the third integrated circuit 1238 and the third planar terminal 1214. Sixth internal interconnects 1252, such as bond wires, ribbon bond wires, or reverse standoff stitch bonding (RSSB), can be between the third integrated circuit 1238 and the external interconnects 1204.

Seventh internal interconnects 1254, such as bond wires, ribbon bond wires, or reverse standoff stitch bonding (RSSB), can be between the fourth integrated circuit 1244 and the external interconnects 1204. Eighth internal interconnects 1256, such as bond wires, ribbon bond wires, or reverse standoff stitch bonding (RSSB), can be between the fourth integrated circuit 1244 and the third integrated circuit 1238.

The encapsulation 1202 can cover the first integrated circuit 1206, the second integrated circuit 1230, the third integrated circuit 1238, and the fourth integrated circuit 1244. The encapsulation 1202 can also cover the first internal interconnects 1222, the second internal interconnects 1224, the third internal interconnects 1226, the fourth internal interconnects 1248, the fifth internal interconnects 1250, the sixth internal interconnects 1252, the seventh internal interconnects 1254, and the eighth internal interconnects 1256.

The first planar terminal 1208, the second planar terminals 1212, and the external interconnects 1204, can be partially exposed by the encapsulation 1202. The encapsulation 1202 can also expose the third planar terminal 1214 and the fourth planar terminals 1258.

Figure 13:
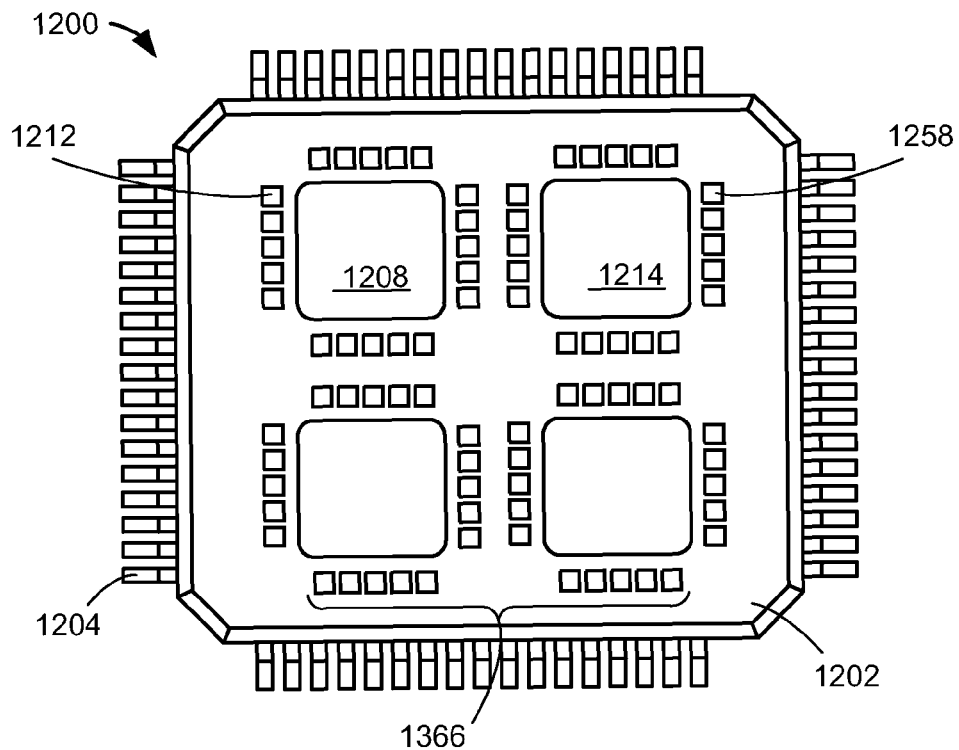
FIG. 13 is a bottom view of the integrated circuit packaging system of FIG. 12.

Referring now to FIG. 13, therein is shown a bottom view of the integrated circuit packaging system 1200 of FIG. 12. The bottom view depicts the encapsulation 1202 exposing the first planar terminal 1208 and the second planar terminals 1212 surrounding the first planar terminal 1208. The encapsulation 1202 can also expose the third planar terminal 1214 surrounded by the fourth planar terminals 1258. The first planar terminal 1208 is between the second planar terminals 1212 and the third planar terminal 1214.

Another set of external planar terminals 1366, such as plated pads, similar to the set of the first planar terminal 1208, the second planar terminals 1212, the third planar terminal 1214, and the fourth planar terminals 1258 can be along a side of the integrated circuit packaging system 1200 opposite the first planar terminal 1208 and the third planar terminal 1214. The external interconnects 1204 can extend from the encapsulation 1202.

Figure 14:
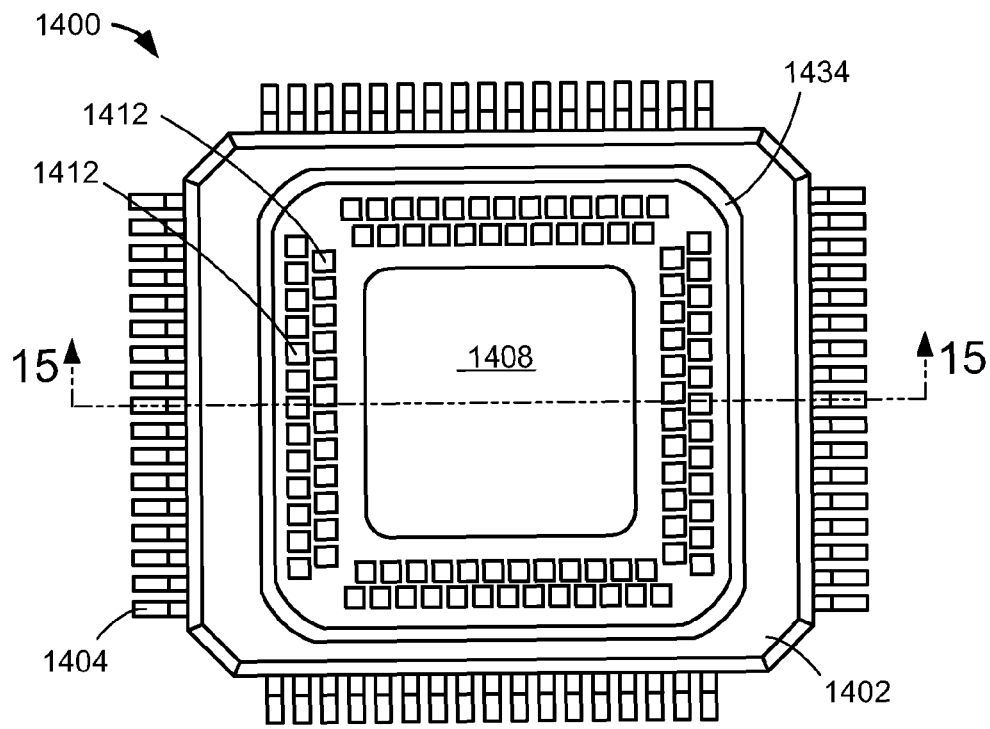
FIG. 14 is a top view of an integrated circuit packaging system in a seventh embodiment of the present invention.

Referring now to FIG. 14, therein is shown a top view of an integrated circuit packaging system 1400 in a seventh embodiment of the present invention. The top view depicts an encapsulation 1402, such as a cover of an epoxy molding compound, having a cavity 1434. The encapsulation 1402 can expose a first planar terminal 1408, such as a plated pad, surrounded by two rows of second planar terminals 1412, such as a plated pad. The second planar terminals 1412 can also be adjacent to and within the periphery of the cavity 1434. External interconnects 1404, such as leads, can extend from the encapsulation 1402.

Figure 15:
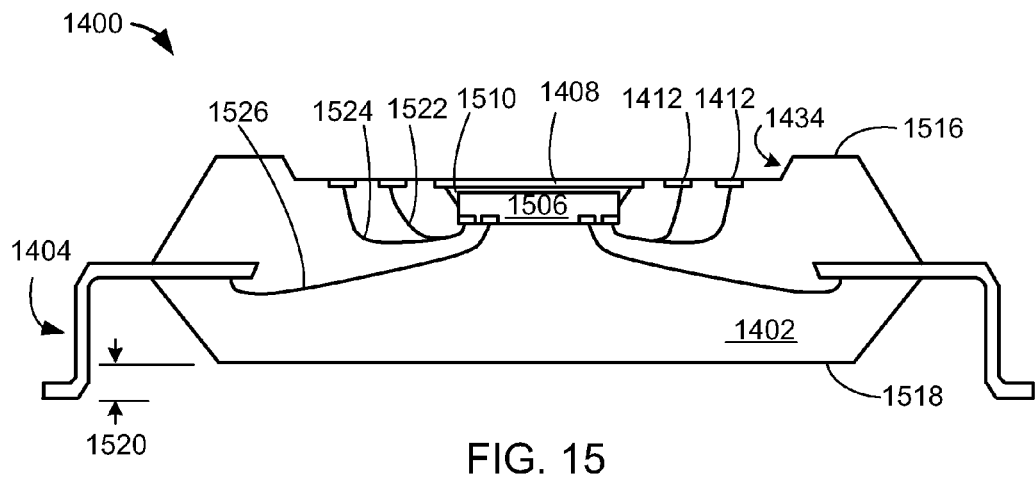
FIG. 15 is a cross-sectional view of the integrated circuit packaging system along line 15-15 of FIG. 14.

Referring now to FIG. 15, therein is shown a cross-sectional view of the integrated circuit packaging system 1400 along line 15-15 of FIG. 14. The integrated circuit packaging system 1400 includes a first integrated circuit 1506, such as an integrated circuit die, can be attached to the first planar terminal 1408 with a first adhesive 1510 such as a die-attach adhesive. The two rows of the second planar terminals 1412 can surround the first planar terminal 1408.

A first side 1516 of the encapsulation 1402 is non-planar and includes the cavity 1434. A second side 1518 of the encapsulation 1402 is on the opposing side of the first side 1516. The external interconnects 1404 can extend from the non-horizontal sides of the encapsulation 1402. As an example, the external interconnects 1404 are shown bending towards the second side 1518 of the encapsulation 1402. Each of the external interconnects 1404 can have an interconnect height 1520 from the second side 1518 of the encapsulation 1402.

First internal interconnects 1522, such as bond wires, ribbon bond wires, or reverse standoff stitch bonding (RSSB), can be between the first integrated circuit 1506 and inner most row of the second planar terminals 1412. Second internal interconnects 1524, such as bond wires, ribbon bond wires, or reverse standoff stitch bonding (RSSB), can be between the first integrated circuit 1506 and outermost row of the second planar terminals 1412. Third internal interconnects 1526, such as bond wires, ribbon bond wires, or reverse standoff stitch bonding (RSSB), can be between the first integrated circuit 1506 and the external interconnects 1404.

The encapsulation 1402 can cover the first integrated circuit 1506, the first internal interconnects 1522, the second internal interconnects 1524, the third internal interconnects 1526. The encapsulation 1402 includes the cavity 1434 exposing the first planar terminal 1408 and the second planar terminals 1412.

Figure 16:
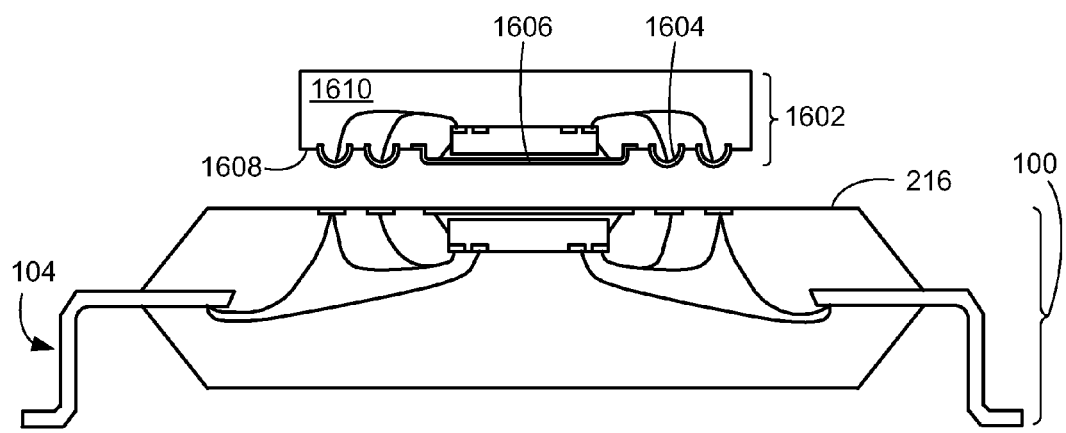
FIG. 16 is a cross-sectional view of an application of the integrated circuit packaging system of FIG. 2 with a device thereover.

Referring now to FIG. 16, therein is shown a cross-sectional view of an application of the integrated circuit packaging system 100 of FIG. 2 with a device 1602 thereover. The integrated circuit packaging system 100 is shown in a vertically flipped orientation from the orientation in FIG. 2. The external interconnects 104 are bend in the opposite direction as shown in FIG. 2.

The device 1602, such as a packaging integrated circuit, can mount over the first side 216 of the integrated circuit packaging system 100. The device 1602 includes mounting planar terminals 1604 and a paddle planar terminal 1606 extending beyond a bottom side 1608 of a top encapsulation 1610 for connection to the integrated circuit packaging system 100.

Figure 17:
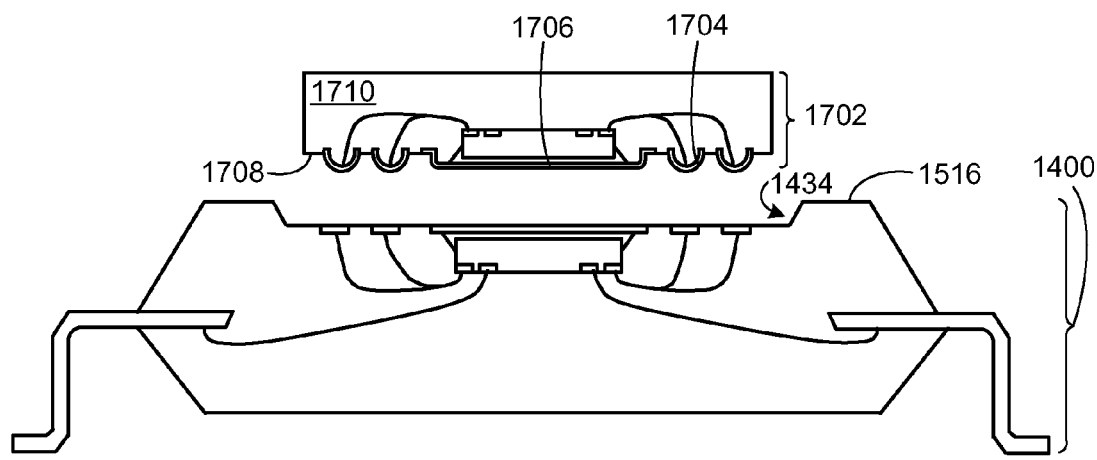
FIG. 17 is a cross-sectional view of an application of the integrated circuit packaging system of FIG. 15 with a device thereover.

Referring now to FIG. 17, therein is shown a cross-sectional view of an application of the integrated circuit packaging system 1400 of FIG. 15 with a device 1702 thereover. The device 1702, such as a package integrated circuit, can mount over the first side 1516 within the cavity 1434 of the integrated circuit packaging system 1400. The device 1702 can include mounting planar terminals 1704 and a paddle planar terminal 1706 extending beyond a bottom side 1708 of a top encapsulation 1710 for connection to the integrated circuit packaging system 1400.

Figure 18:
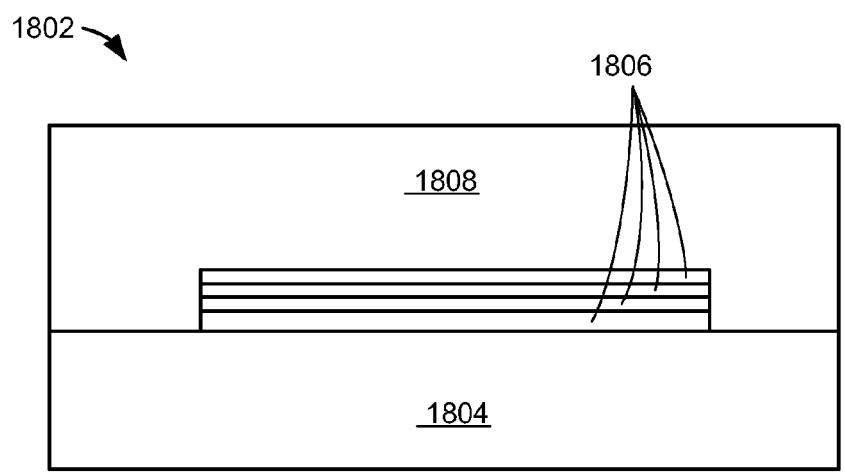
FIG. 18 is a more detailed cross-sectional view of a planar terminal.

Referring now to FIG. 18, therein is shown a more detailed cross-sectional view of a planar terminal 1802. The planar terminal 1802, such as a plated pad, can represent any of the planar terminals in the first embodiment through the seventh embodiments. The planar terminal 1802 can be formed over a base 1804, such as a copper base. The base 1804 can be removed, such as etched away, for exposing the planar terminal 1802.

Metal layers 1806 can be stacked over the base 1804 for forming the planar terminal 1802. The metal layers 1806 can be formed with gold (Au), palladium (Pd), nickel (Ni), silver (Ag), tin (Sn), an alloy, or any combination thereof. The metal layers 1806 can be formed by electro-plating the one layer above another. An encapsulation 1808, such a cover including epoxy molding compound, cover surround the planar terminal 1802. The removal of the base 1804 exposes the planar terminal 1802.

Figure 19:
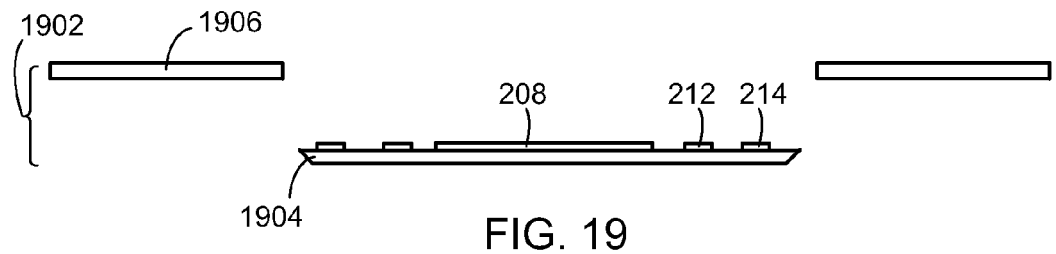
FIG. 19 is a cross-sectional view of a portion a lead frame.

Referring now to FIG. 19, therein is shown a cross-sectional view of a portion of a lead frame 1902. The cross-sectional view depicts a paddle 1904 such as a copper paddle, between electrical connectors 1906. The first planar terminal 208, the second planar terminals 212, and the third planar terminals 214 can be formed over the paddle 1904.

The second planar terminals 212 can be between the third planar terminals 214 and the first planar terminal 208. The first planar terminal 208, the second planar terminals 212, and the third planar terminals 214 can be formed through electroplating as shown in FIG. 18. As an example, the electrical connectors 1906 are shown non-planar with the paddle 1904.

Figure 20:
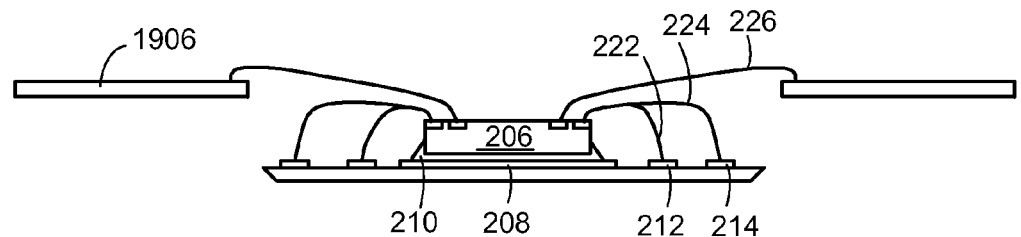
FIG. 20 is the structure of FIG. 19 in connecting the integrated circuit.

Referring now to FIG. 20, therein is shown the structure of FIG. 19 in connecting the integrated circuit 206. The first integrated circuit 206 can be over the first planar terminal 208 with the first adhesive 210. The first internal interconnects 222 can be between the first integrated circuit 206 and the second planar terminals 212. The second internal interconnects 224 can be between the first integrated circuit 206 and the third planar terminals 214. The third internal interconnects 226 can be between the first integrated circuit 206 and the electrical connectors 1906.

Figure 21:
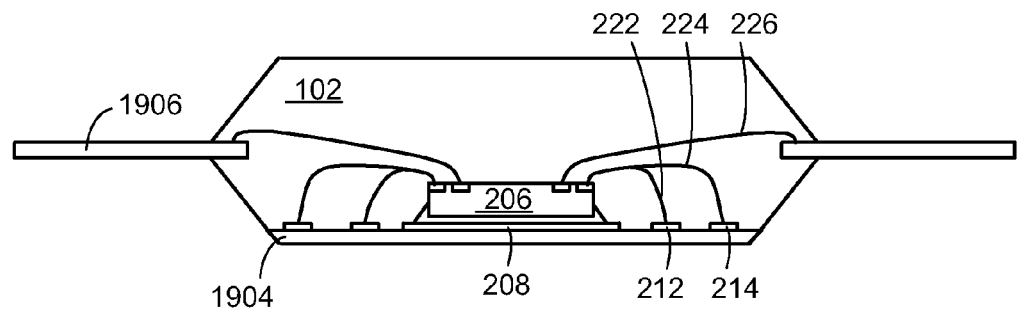
FIG. 21 is the structure of FIG. 20 in forming the encapsulation.

Referring now to FIG. 21, therein is shown the structure of FIG. 20 in a forming the encapsulation 102. The encapsulation 102 can be injected molded over the first integrated circuit 206, the interior portion of the electrical connectors 1906, the first internal interconnects 222, the second internal interconnects 224 and the third internal interconnects 226.

The paddle 1904 bounds the molding process. The encapsulation 102 is formed over but not under the first planar terminal 208, the second planar terminals 212, and the third planar terminals 214. The electrical connectors 1906 can extend from the non-horizontal sides of the encapsulation 102.

Figure 22:
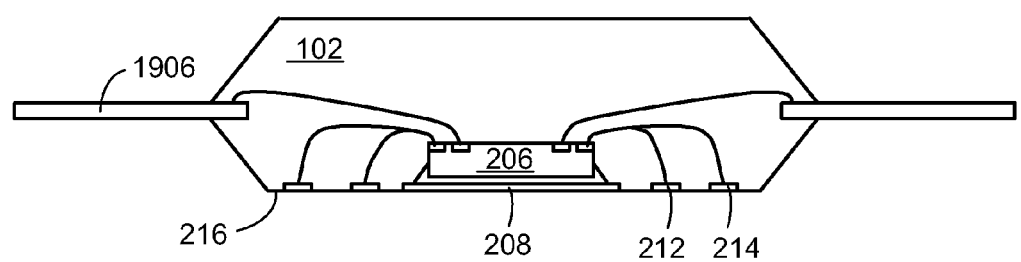
FIG. 22 is the structure of FIG. 21 in forming the integrated circuit packaging system of FIG. 2.

Referring now to FIG. 22, therein is shown the structure of FIG. 21 in forming the integrated circuit packaging system 100 of FIG. 2. The structure of FIG. 21 undergoes a removal process, such as etching, for removing the paddle 1904 of FIG. 21 from the encapsulation 102. The removal process exposes the first planar terminal 208, the second planar terminals 212, and the third planar terminals 214. The removal process also exposes the first side 216 of the encapsulation 102. The structure can undergo singulation and forming or bending to shape the electrical connectors 1906 to the external interconnects 104 of FIG. 2.

Figure 23:
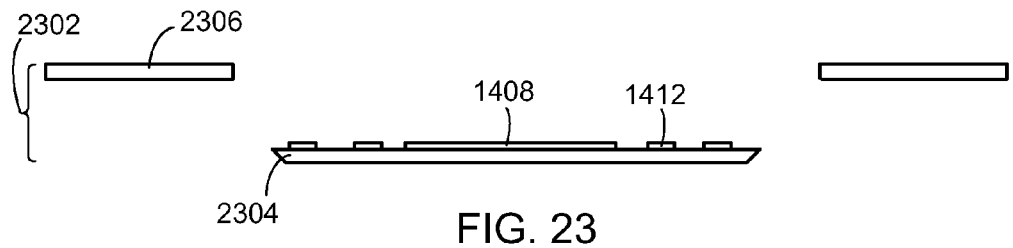
FIG. 23 is a cross-sectional view of a portion of a lead frame.

Referring now to FIG. 23, therein is shown a cross-sectional view of a portion of a lead frame 2302. The cross-sectional view depicts a paddle 2304 such as a copper paddle, between electrical connectors 2306. The first planar terminal 1408 and the rows of the second planar terminals 1412 can be formed over the paddle 2304.

The first planar terminal 1408 and the second planar terminals 1412 can be formed through electro-plating as shown in FIG. 18. As an example, the electrical connectors 2306 are shown non-planar with the paddle 2304.

Figure 24:
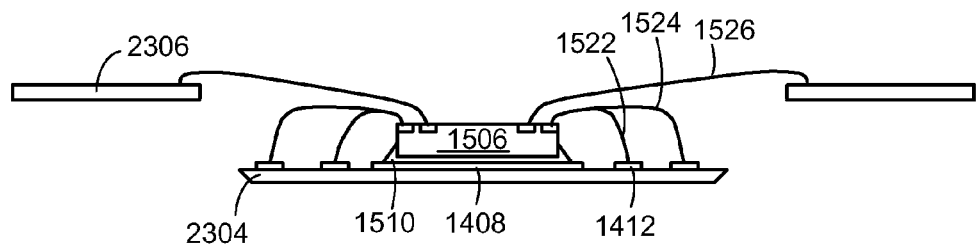
FIG. 24 is the structure of FIG. 23 in connecting the first integrated circuit.

Referring now to FIG. 24, therein is shown the structure of FIG. 23 in connecting the first integrated circuit 1506. The first integrated circuit 1506 can be over the first planar terminal 1408 with the first adhesive 1510. The first internal interconnects 1522 can be between the first integrated circuit 1506 and the innermost row of the second planar terminals 1412. The second internal interconnects 1524 can be between the first integrated circuit 1506 and the outermost row of the second planar terminals 1412. The third internal interconnects 1526 can be between the first integrated circuit 1506 and the electrical connectors 2306.

Figure 25:
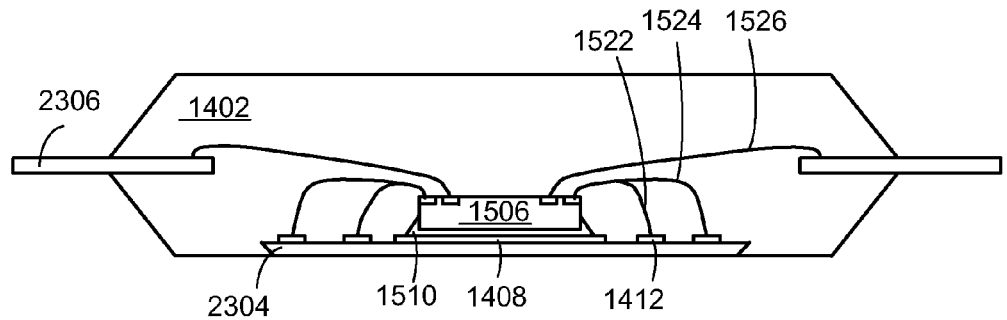
FIG. 25 is the structure of FIG. 24 in forming the encapsulation.

Referring now to FIG. 25, therein is shown the structure of FIG. 24 in a forming the encapsulation 1402. The encapsulation 1402 can be injected molded over the first integrated circuit 1506, the interior portion of the electrical connectors 2306, the first internal interconnects 1522, the second internal interconnects 1524 and the third internal interconnects 1526.

The paddle 2304 bounds the molding process. The encapsulation 1402 is formed over but not under the first planar terminal 1408, and the second planar terminals 1412. The encapsulation 1402 surrounds the paddle 2304. The electrical connectors 2306 can extend from the non-horizontal sides of the encapsulation 1402.

Figure 26:
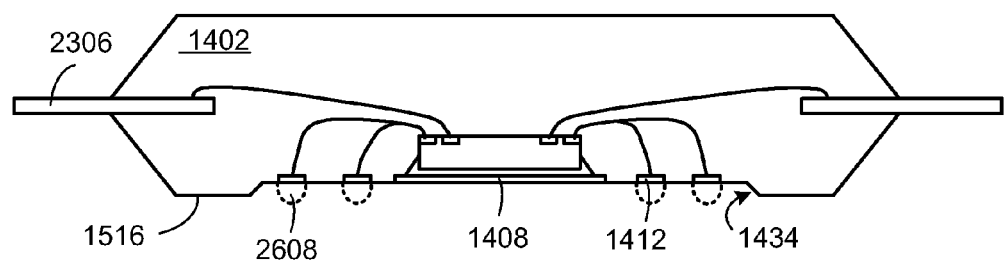
FIG. 26 is the structure of FIG. 25 in forming the integrated circuit packaging system of FIG. 15.

Referring now to FIG. 26, therein is shown the structure of FIG. 25 in forming the integrated circuit packaging system 1400 of FIG. 15. The structure of FIG. 24 undergoes a removal process, such as etching, for removing the paddle 2304 of FIG. 25 from the encapsulation 1402. The removal process can form the cavity 1434 in the encapsulation 1402. The cavity 1434 can expose the first planar terminal 1408 and the second planar terminals 1412.

The removal process also exposes the first side 1516 of the encapsulation 1402. External connectors 2608, such as conductive balls or solder balls, can attach to the second planar terminals 1412 within the cavity 1434. The external connectors 2608 are optional and can be used for connection to the next system level (not shown), such as a printed circuit board. The structure can undergo singulation and forming or bending to shape the electrical connectors 2306 to the external interconnects 1404 of FIG. 15.

Figure 27:
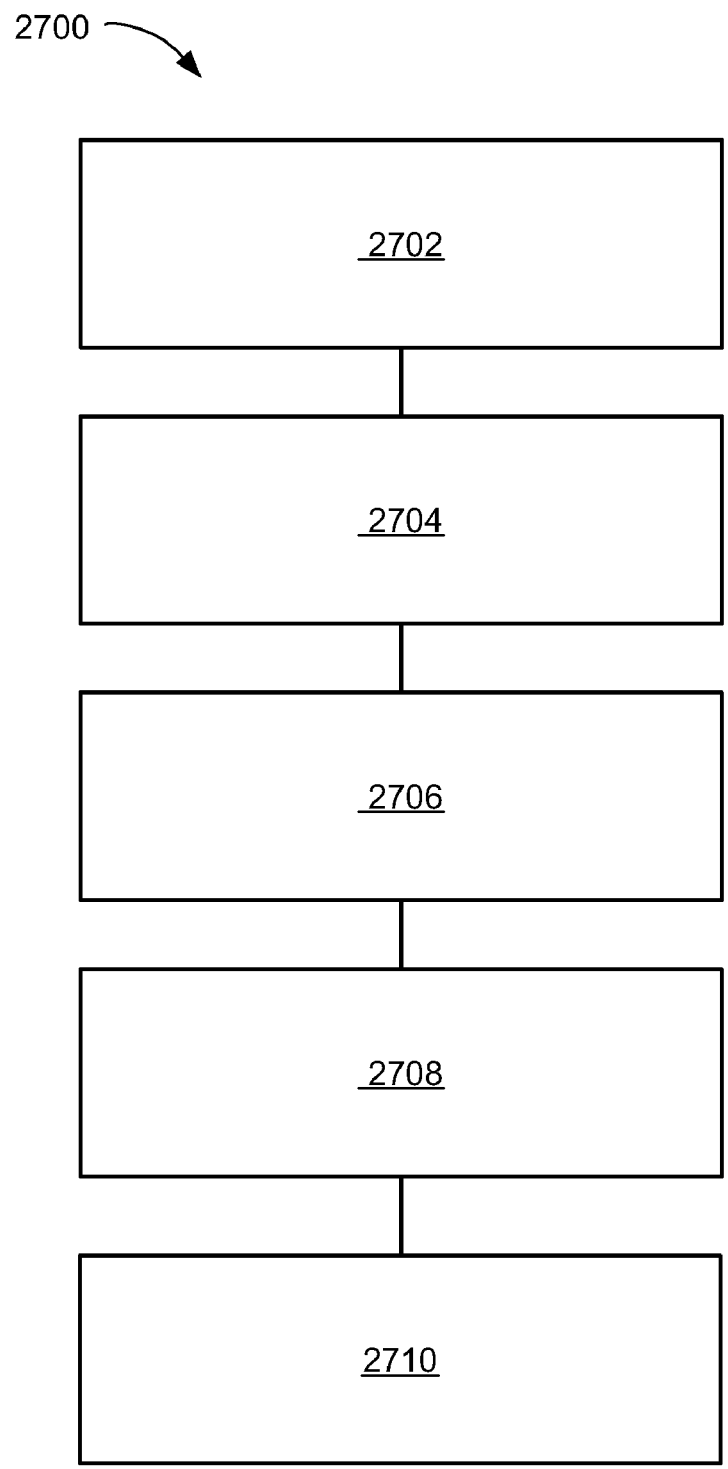
FIG. 27 is a flow chart of method of manufacture of an integrated circuit packaging system in a further embodiment of the present invention.

Referring now to FIG. 27, therein is shown a flow chart of a method 2700 of manufacture of the integrated circuit packaging system 100 in a further embodiment of the present invention. The method 2700 includes forming an external interconnect in a block 2702; forming a first planar terminal adjacent to the external interconnect and non-planar to a portion of the external interconnect in a block 2704; mounting a first integrated circuit over the first planar terminal in a block 2706; connecting a first integrated circuit with the external interconnect in a block 2708; and forming an encapsulation over the first planar terminal covering the first integrated circuit and with the external interconnect extending from a non-horizontal side of the encapsulation and with the first planar terminal coplanar with the adjacent portion of the encapsulation exposing the first planar terminal in a block 2710.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit packaging system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit packaging devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   forming an external interconnect;
   forming a first planar terminal, made only of plated metal layers, adjacent to the external interconnect and non-planar to a portion of the external interconnect;
   mounting a first integrated circuit over the first planar terminal;
   connecting the first integrated circuit with the external interconnect; and
   forming an encapsulation over the first planar terminal covering the first integrated circuit and with the external interconnect extending from a non-horizontal side of the encapsulation and with the first planar terminal coplanar with the adjacent portion of the encapsulation exposing the first planar terminal.

2. The method as claimed in claim 1 wherein forming the encapsulation includes forming the encapsulation along a perimeter of the first planar terminal is planar to the first planar terminal.

3. The method as claimed in claim 1 wherein:
   forming the first planar terminal includes forming a second planar terminal; and
   further comprising:
   connecting the first integrated circuit and the second planar terminal.

4. The method as claimed in claim 1 further comprising:
   mounting a second integrated circuit over the first integrated circuit; and
   connecting the second integrated circuit and the first integrated circuit.

5. The method as claimed in claim 1 wherein:
   forming the first planar terminal includes forming a second planar terminal; and
   further comprising:
   connecting the external interconnect and the second planar terminal.

6. A method of manufacture of an integrated circuit packaging system comprising:
   forming a lead;
   plating a first planar terminal and a second planar terminal adjacent and planar to each other, and both adjacent to the lead and non-planar to a portion the lead, the first planar terminal and the second planar terminal made only of plated metal layers;
   mounting a first integrated circuit over the first planar terminal;
   connecting the first integrated circuit with the lead; and
   forming an encapsulation over the first planar terminal covering the first integrated circuit and with the lead extending from a non-horizontal side of the encapsulation and with the first planar terminal coplanar with the adjacent portion of the encapsulation along a perimeter of the first planar terminal exposing the first planar terminal.

7. The method as claimed in claim 6 wherein forming the encapsulation includes forming the encapsulation having a cavity with the first planar terminal and the second planar terminal exposed within the cavity.

8. The method as claimed in claim 6 further comprising mounting a device to the second planar terminal.

9. The method as claimed in claim 6 wherein:
   forming the encapsulation includes forming the encapsulation having a cavity with the second planar terminal exposed within the cavity; and
   further comprising:
   mounting a device in the cavity and over the second planar terminal.

10. The method as claimed in claim 6 wherein:
    forming the encapsulation includes forming the encapsulation having a cavity with the second planar terminal exposed within the cavity; and
    further comprising:
    attaching an external connector to the second planar terminal.

11. An integrated circuit packaging system comprising:
    an external interconnect;
    a first planar terminal, made only of plated metal layers, adjacent to the external interconnect and non-planar to a portion of the external interconnect;
    a first integrated circuit over the first planar terminal and connected with the external interconnect; and
    an encapsulation over the first planar terminal covering the first integrated circuit and with the external interconnect extending from a non-horizontal side of the encapsulation and with the first planar terminal coplanar with the adjacent portion of the encapsulation exposing the first planar terminal.

12. The system as claimed in claim 11 wherein the encapsulation includes the encapsulation along a perimeter of the first planar terminal is planar to the first planar terminal.

13. The system as claimed in claim 11 further comprising:
    a second planar terminal adjacent to and planar with the first planar terminal; and
    wherein:
    the first integrated circuit is connected to the second planar terminal.

14. The system as claimed in claim 11 further comprising a second integrated circuit over and connected to the first integrated circuit.

15. The system as claimed in claim 11 further comprising:
    a second planar terminal adjacent to and planar with the first planar terminal; and
    wherein:
    the external interconnect is connected to the second planar terminal.

16. The system as claimed in claim 11 wherein:
    the external interconnect is a lead;
    the encapsulation along a perimeter of the first planar terminal is planar to the first planar terminal; and
    further comprising:
    a second planar terminal adjacent and planar to the first planar terminal.

17. The system as claimed in claim 16 wherein the encapsulation includes the encapsulation having a cavity with the first planar terminal and the second planar terminal exposed within the cavity.

18. The system as claimed in claim 16 further comprising a device mounted to the second planar terminal.

19. The system as claimed in claim 16 wherein:
    the encapsulation includes the encapsulation having a cavity with the second planar terminal exposed within the cavity; and
    further comprising:
    a device in the cavity and over the second planar terminal.

20. The system as claimed in claim 16 wherein:
    the encapsulation includes the encapsulation having a cavity with the second planar terminal exposed within the cavity; and
    further comprising:
    an external connector attached to the second planar terminal.

* * * * *